(12) United States Patent
Hirukawa et al.

(10) Patent No.: US 7,123,641 B2
(45) Date of Patent: Oct. 17, 2006

(54) SEMICONDUCTOR LASER DEVICE AND OPTICAL DISC UNIT

(75) Inventors: Shuichi Hirukawa, Nara (JP); Hidenori Kawanishi, Oxford (GB); Katsuhiko Kishimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 275 days.

(21) Appl. No.: 10/788,411

(22) Filed: Mar. 1, 2004

(65) Prior Publication Data

US 2004/0223527 A1    Nov. 11, 2004

(30) Foreign Application Priority Data

Mar. 26, 2003    (JP) .......................... P2003-085139

(51) Int. Cl.
*H01S 5/323*    (2006.01)

(52) U.S. Cl. .................................. 372/45.01

(58) Field of Classification Search ............. 372/45.01, 372/45.011, 45.012
See application file for complete search history.

(56) References Cited

U.S. PATENT DOCUMENTS

| | | | |
|---|---|---|---|
| 5,757,833 A * | 5/1998 | Arakawa et al. ......... | 372/45.01 |
| 5,995,528 A * | 11/1999 | Fukunaga et al. ....... | 372/45.01 |
| 6,028,874 A * | 2/2000 | Wada et al. ........... | 372/45.011 |
| 6,127,691 A * | 10/2000 | Fukunaga et al. ......... | 257/17 |
| 6,195,373 B1 * | 2/2001 | Fukunaga ................ | 372/45.01 |
| 2001/0026571 A1 * | 10/2001 | Hayakawa .................. | 372/45 |
| 2002/0122447 A1 * | 9/2002 | Fukunaga et al. ........... | 372/43 |

FOREIGN PATENT DOCUMENTS

| | | |
|---|---|---|
| JP | 10-4237 | 1/1998 |
| JP | 10-215021 A | 8/1998 |
| JP | 11-112087 A | 4/1999 |
| JP | 11-220224 | 8/1999 |
| JP | 11-274644 | 10/1999 |
| JP | 2002-217493 A | 8/2002 |
| JP | 2003-86902 | 3/2003 |

OTHER PUBLICATIONS

T. Fukunaga et al., "Highly Reliable Operation of High-Power InGaAsP/InGaP/AlGaAs 0.8 um Separate Confinement Heterostructure Lasers," Jpn. J. Appl. Phys., vol. 34, No. 9B, Sep. 15, 1995, pp. L1175-L1177.*

J.K. Wade et al., "6.1 W COntinuous Wave Front-Facet Power From Al-Free Active-Region (lambda=805 nm) Diode Lasers," Appl. Phys. Lett., vol. 72, No. 1, Jan. 5, 1998, pp. 4-6.*

Chinese Office Action dated Jul. 22, 2005, issued in counterpart foreign application.

* cited by examiner

*Primary Examiner*—James Menefee
(74) *Attorney, Agent, or Firm*—Morrison & Foerster LLP

(57) ABSTRACT

In a semiconductor laser device having an oscillation wavelength of larger than 760 nm and smaller than 800 nm, on an n-type GaAs substrate (101), there are stacked in sequence an n-type first and second lower cladding layers (103, 104), a lower guide layer (106), a strained InGaAsP multiquantum well active layer (107), an upper guide layer (109), and a p-type upper cladding layer (110). Since the lower guide layer (106) is formed of InGaP, leakage of carriers from an active region is reduced. Also, since the upper guide layer (109) is formed of AlGaAs, an overflow of carriers (electrons in particular) is suppressed.

14 Claims, 10 Drawing Sheets

SEMICONDUCTOR LASER DEVICE AND OPTICAL DISC UNIT

This nonprovisional application claims priority under 35 U.S.C. §119(a) on Patent Application No. 2003-085139 filed in Japan on Mar. 26, 2003, the entire contents of which are hereby incorporated by reference.

BACKGROUND OF THE INVENTION

The present invention relates to a semiconductor laser device and an optical disc unit, in particular to a semiconductor laser device that can realize high output and high reliability, and an optical disc unit using the same.

Semiconductor laser devices are used in optical communication devices, optical recording devices and so on. Recently, there are increasing needs for high speed and large capacity in such devices. In order to meet the demands, research and development has been advanced for improving various characteristics of semiconductor laser devices.

Among them, a 780 nm band semiconductor laser device, which is used in an optical disc unit such as a conventional CD or CD-R/RW, is usually made of AlGaAs materials. Since demands for high-speed writing have been increasing also in the CD-R/RW, high-output semiconductor laser devices are requested in order to satisfy these demands.

As a conventional AlGaAs semiconductor laser device, there is one as shown in FIG. 10 (see, e.g., JP 11-274644). The structure of the AlGaAs semiconductor laser device will be briefly described. As shown in FIG. 10, on an n-type GaAs substrate 501, there are an n-type GaAs buffer layer 502, an n-type $Al_{0.5}Ga_{0.5}As$ lower cladding layer 504, an $Al_{0.35}Ga_{0.65}As$ lower guide layer 503, a multiquantum well active layer 505 composed of two $Al_{0.12}Ga_{0.88}As$ well layers (each layer having a thickness of 80 Å) and three $Al_{0.35}Ga_{0.65}As$ barrier layers (each layer having a thickness of 50 Å) disposed alternately, an $Al_{0.35}Ga_{0.65}As$ upper guide layer 506, a p-type $Al_{0.5}Ga_{0.5}As$ first upper cladding layer 507 and a p-type GaAs etching stopper layer 508 that are stacked in this order. A mesa stripe-shaped p-type $Al_{0.5}Ga_{0.5}As$ second upper cladding layer 509 and an eaves-shaped p-type GaAs cap layer 510 are sequentially formed on a surface of the etching stopper layer 508. An n-type $Al_{0.3}Ga_{0.3}As$ first current blocking layer 511 and an n-type GaAs second current blocking layer 512 are stacked on both sides of the second upper cladding layer 509, so that regions other than the mesa stripe portion are defined as current constriction portions. A p-type GaAs planarizing layer 513 is formed on the second current blocking layer 512, and a p-type GaAs contact layer 514 is laid on the entire surface thereof.

The semiconductor laser device has a threshold current of 35 mA and a COD (Catastrophic Optical Damage) level of about 160 mW.

However, in the semiconductor laser device that employs the AlGaAs materials, "end-face damage" caused by COD is liable to occur on laser light-emitting end faces during the high-power operation, due to influence of active Al (aluminum) atoms. As a result, such a semiconductor laser device only had a maximum optical output of about 160 mW. The end-face damage caused by COD is presumed to occur by the following mechanism. In the end faces of a resonator, because Al is easily oxidized, a surface level is formed thereby. Carriers injected into the active layer are relaxed through the level, when heat is emitted. Therefore, the temperature increases locally. The increase in the temperature reduces the bandgap of the active layer in the vicinity of the end faces. As a result, absorption of laser light in the vicinity of the end faces increases, and the number of carriers that are relaxed through the surface level increases resulting in further generation of heat. By repeating such a positive feedback, the end faces are finally melted resulting in stop of oscillation. Since Al is contained in an active region in the conventional semiconductor laser device, the end-face damage on the basis of the above principle becomes a big problem.

The present inventors have proceeded with the study on high-output semiconductor laser devices that employ InGaAsP materials that contain no Al (Al-free materials). As a result, a semiconductor laser device having a maximum optical output of up to almost 250 mW was realized, but sufficient reliability and temperature characteristics were not obtained. Inspecting this semiconductor laser device, the inventors found the possibility that carriers injected in the active region were liable to leak to the outside of the active region under high-temperature atmosphere or in high-power operation.

SUMMARY OF THE INVENTION

It is an object of the present invention to provide a semiconductor laser device that is highly reliable even in high-power operation and has a long lifetime, and an optical disc unit using the semiconductor laser device.

In order to accomplish the above object, a semiconductor laser device according to a first aspect of the present invention includes:

a GaAs substrate;

an InGaAsP quantum well active layer supported on the GaAs substrate, said quantum well active layer being composed of one or a plurality of well layers and a plurality of barrier layers alternately disposed;

an n-type cladding layer and a p-type cladding layer, which are provided in a manner so as to interpose the quantum well active layer therebetween;

a first guide layer provided between the n-type cladding layer and the quantum well active layer; and a second guide layer provided between the p-type cladding layer and the quantum well active layer, wherein the semiconductor laser device has an oscillation wavelength of larger than 760 nm and smaller than 800 nm, and the first guide layer is formed of InGaP.

In the case where the GaAs substrate is of n-type, the n-type cladding layer and the first guide layer are located on a side closer to the substrate than the quantum well layer(s), and serve as a lower cladding layer and a lower guide layer, respectively. On the other hand, in the case where the GaAs substrate is of p-type, the n-type cladding layer and the first guide layer are located on a side farther from the substrate than the quantum well layer(s), and serve as an upper cladding layer and an upper guide layer, respectively.

According to the present invention, a semiconductor laser device having an oscillation wavelength of more than 760 nm and less than 800 nm and a COD level of higher than that of an AlGaAs semiconductor laser device is achievable. Furthermore, because the first guide layer interposed between the quantum well layer(s) and the n-type cladding layer is formed of InGaP, leakage of carriers from the active region can be reduced more compared with the AlGaAs semiconductor laser device. Thus, it is possible to realize a high-output semiconductor laser device using a GaAs substrate (in particular, a 780 nm band high-output semiconductor laser device for use of CD-R/RW) that has favorable temperature characteristics in a high-output operation.

In one embodiment, the second guide layer is formed of AlGaAs. AlGaAs is disposed in a manner so as not to be immediately adjacent to the well layer(s) where radiative recombination occurs. This makes it possible to ensure the reliability and, at the same time, sufficiently suppress an overflow of carriers (electrons in particular) by a conduction band bottom energy level (Ec) of AlGaAs. Accordingly, a semiconductor laser device having high reliability and a long lifetime is advantageously realized. If the Al mole fraction in AlGaAs constituting the second guide layer is more than 0.2, the above effect can be realized more favorably.

In one embodiment, the first guide layer has a thickness of 30 Å or more, whereby leakage of holes is suppressed more. This makes it possible to obtain a semiconductor laser device having good temperature characteristics, reliability and a long lifetime in high-output operation. Further, if the first guide layer has a composition which is lattice-matched with the GaAs substrate or which has a compressive strain or a tensile strain of not more than 1% with respect to the GaAs substrate, a similar effect can favorably be obtained.

In one embodiment, a luminous shape stabilizer guide layer formed of AlGaAs is provided between the first guide layer and the n-type cladding layer, whereby light distribution with more stable shape is obtained. Thus, good reliability is achievable in high-output operation. If the Al mole fraction of the luminous shape stabilizer guide layer is 0.2 or more, the above effect can favorably be achieved.

In one embodiment of the semiconductor laser device, InGaAsP quantum well active layer having a compressive strain with respect to the GaAs substrate is used. Thus, the oscillation threshold current is reduced and this realizes a high-output semiconductor laser device which is highly reliable particularly in a 780 nm band and which has a long lifetime.

In one embodiment, a quantity of the compressive strain is not more than 3.5%. Thus, the above effect is favorably obtained.

In one embodiment, InGaAsP barrier layers having a tensile strain are used. The strain quantity of the barrier layers compensates the compressive strain of the well layer(s) and thus a strained quantum well active layer having more stable crystals is fabricated. Therefore, a semiconductor laser device with high reliability is realized.

In one embodiment, a quantity of the tensile strain is not more than 3.5%. Thus, the above effect is favorably obtained.

An optical disc unit according to a second aspect of the present invention employs the semiconductor laser device, as described above, which operates with higher optical power than conventional. Therefore, data read and write operations are implementable even if the rotational speed of the optical disk is made higher than conventional. Accordingly, the access time to optical disks, which has hitherto mattered particularly in write operations, becomes much shorter than in a system using the conventional semiconductor laser device. This makes it feasible to provide an optical disk unit which is operable more comfortably.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

A semiconductor laser device and an optical disc unit of the present invention will hereinafter be described by embodiments illustrated.

First Embodiment

Figure 1:
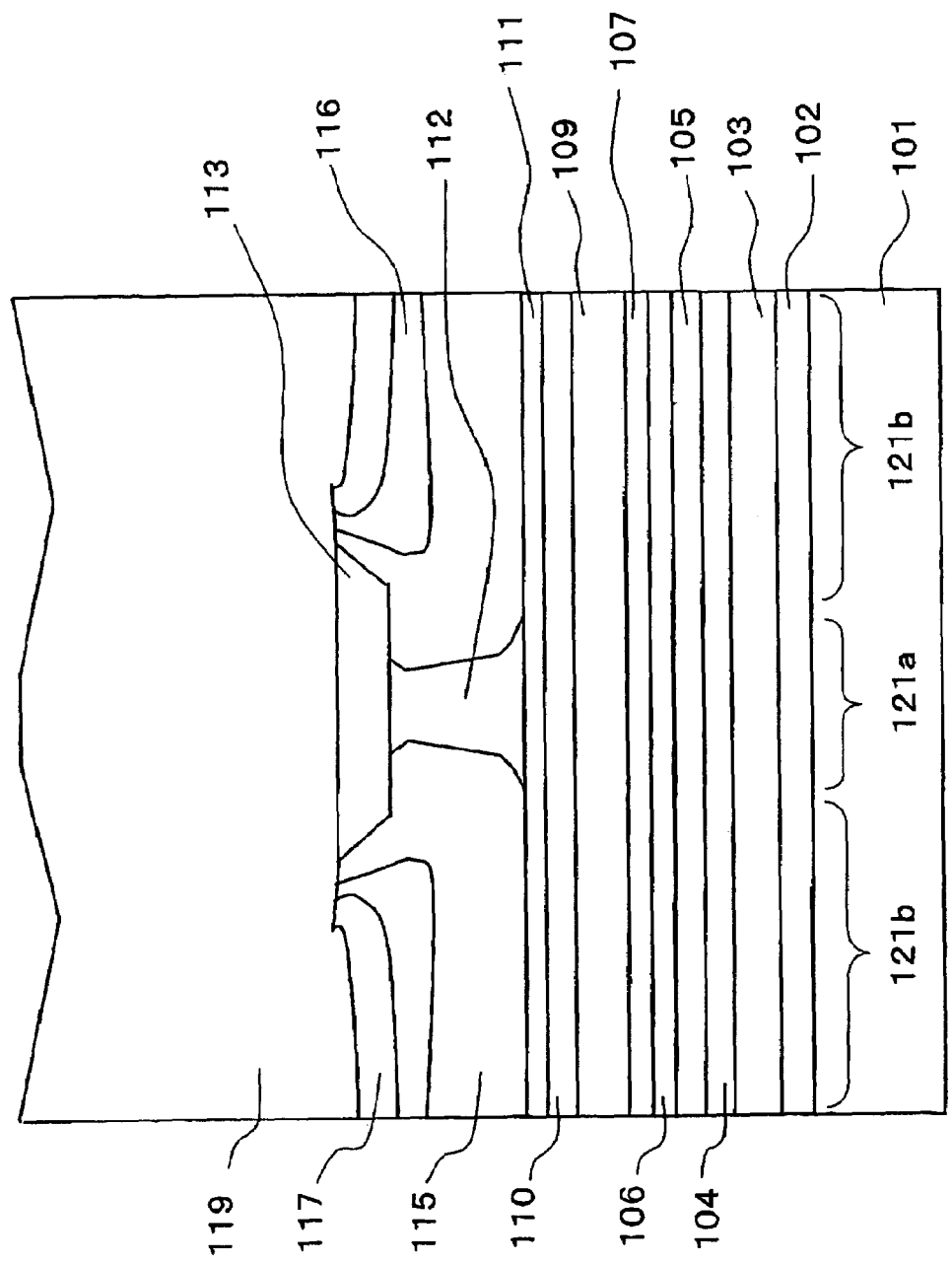
FIG. 1 is a cross section of a semiconductor laser device according to a first embodiment of the present invention, taken along a plane perpendicular to a stripe direction of the device.

FIG. 1 is a view showing the structure of a semiconductor laser device in a first embodiment of the present invention. In this semiconductor laser device, as shown in FIG. 1, on an n-type GaAs substrate 101, there are stacked in sequence an n-type GaAs buffer layer 102, an n-type $Al_{0.4488}Ga_{0.5512}As$ first lower cladding layer 103, an n-type $Al_{0.5471}Ga_{0.4529}As$ second lower cladding layer 104, an $Al_{0.429}Ga_{0.571}As$ luminous shape stabilizer lower guide layer 105, an $In_{0.49}Ga_{0.51}P$ lower guide layer 106, a strained multiquantum well active layer 107, an $Al_{0.429}Ga_{0.571}As$ upper guide layer 109, a p-type $Al_{0.4885}Ga_{0.5115}As$ first upper cladding layer 110, and a p-type GaAs etching stopper layer 111. Also, on the etching stopper layer 111, there are provided a mesa stripe-shaped p-type $Al_{0.4885}Ga_{0.5115}As$ second upper cladding layer 112 and a GaAs cap layer 113, and both sides of the mesa stripe-shaped p-type $Al_{0.4885}Ga_{0.5115}As$ second upper cladding layer 112 and the GaAs cap layer 113 are filled with an n-type $Al_{0.7}Ga_{0.3}As$ first current blocking layer 115, an n-type GaAs second current blocking layer 116, and a p-type GaAs planarizing layer 117, which layers define a light/current constriction area. Further, a p-type GaAs cap layer 119 is provided on the entire surface. The semiconductor laser device has a mesa stripe portion 121a and lateral portions 121b provided on both lateral sides of the mesa stripe portion 121a.

Figure 2:
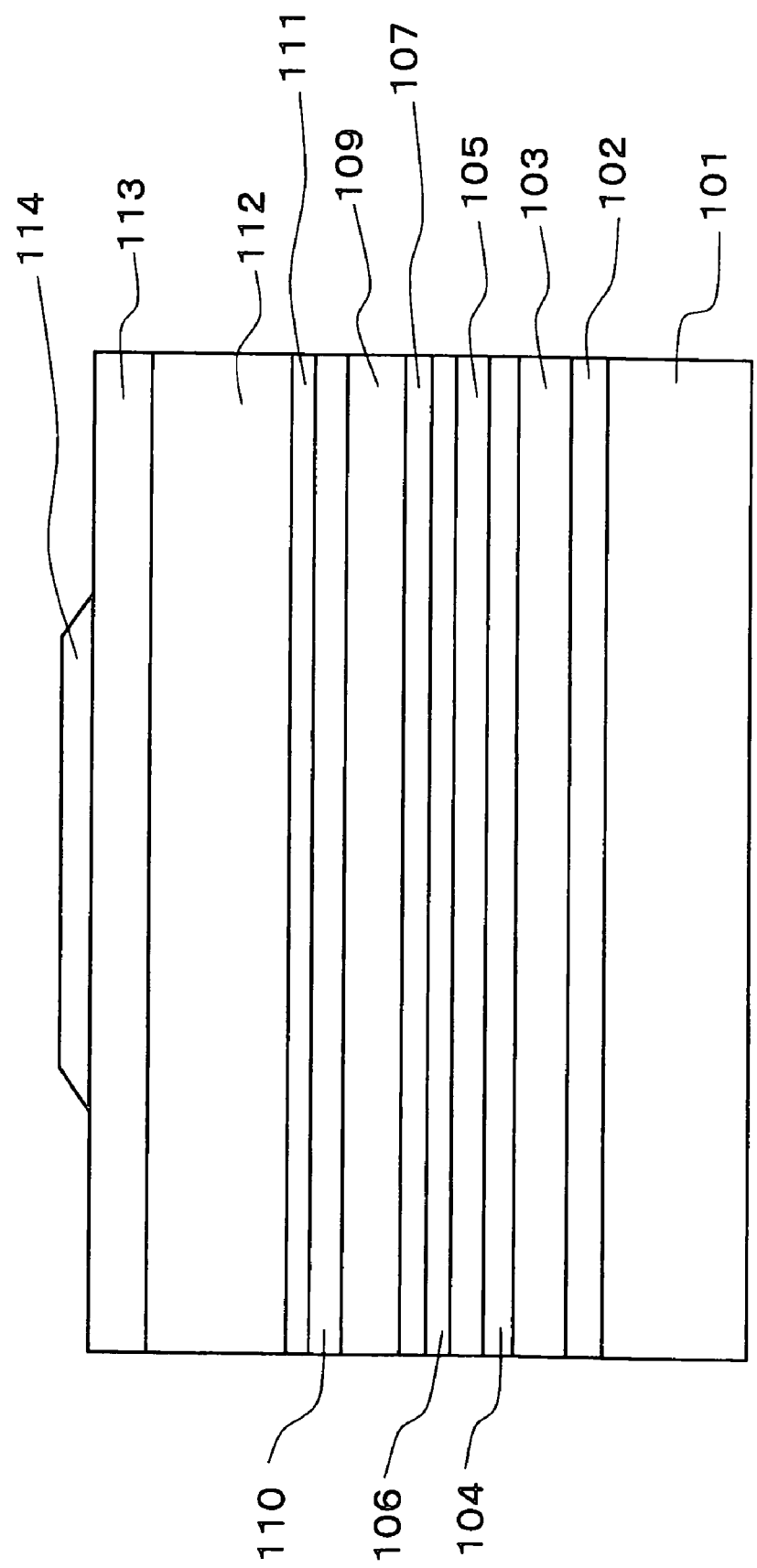
FIG. 2 a cross section of the semiconductor laser device after completion of a first crystal growth and masking process, taken along the plane perpendicular to the stripe direction.

Next, with reference to FIGS. 2–4, a process for fabricating the semiconductor laser structure will be described. As shown in FIG. 2, on an n-type GaAs substrate 101 having a (100) plane, there are stacked in sequence an n-type GaAs buffer layer 102 (thickness of 0.5 μm), an n-type $Al_{0.4488}Ga_{0.5512}As$ first lower cladding layer 103 (thickness of 3.0 μm), an n-type $Al_{0.5471}Ga_{0.4529}As$ second lower cladding layer 104 (thickness of 0.3 μm), an $Al_{0.429}Ga_{0.571}As$ luminous shape stabilizer lower guide layer 105 (thickness of 1830 Å), an $In_{0.49}Ga_{0.51}P$ lower guide layer 106 (thickness of 100 Å), a strained multiquantum well active layer 107 composed of three $In_{0.2655}Ga_{0.7345}As_{0.5972}P_{0.4028}$ compressively-strained quantum well layers (strain of 0.4865%, each layer having a thickness of 50 Å) and four $In_{0.1109}Ga_{0.8891}As_{0.4071}P_{0.5929}$ barrier layers (strain of −1.31%, the layers having a thickness of 70 Å, 50 Å, 50 Å, 70 Å, respectively, from a substrate side) disposed alternately, an $Al_{0.429}Ga_{0.571}As$ upper guide layer 109 (thickness of 1830 Å), a p-type $Al_{0.4885}Ga_{0.5115}As$ first upper cladding layer 110 (layer thickness of 0.16 μm), a p-type GaAs etching stopper layer 111 (thickness of 30 Å), a p-type $Al_{0.4885}Ga_{0.5115}As$ second upper cladding layer 112 (thickness of 1.28 μm) and a GaAs cap layer 113 (thickness of 0.75 μm) through crystal growth by metal organic chemical vapor deposition.

Further, referring to FIG. 2, a resist mask 114 (mask width of 5.5 μm) is formed on a portion where a mesa-stripe portion is to be formed, by a photolithography process so that the mesa stripe portion will extend in the (011) direction.

Figure 3:
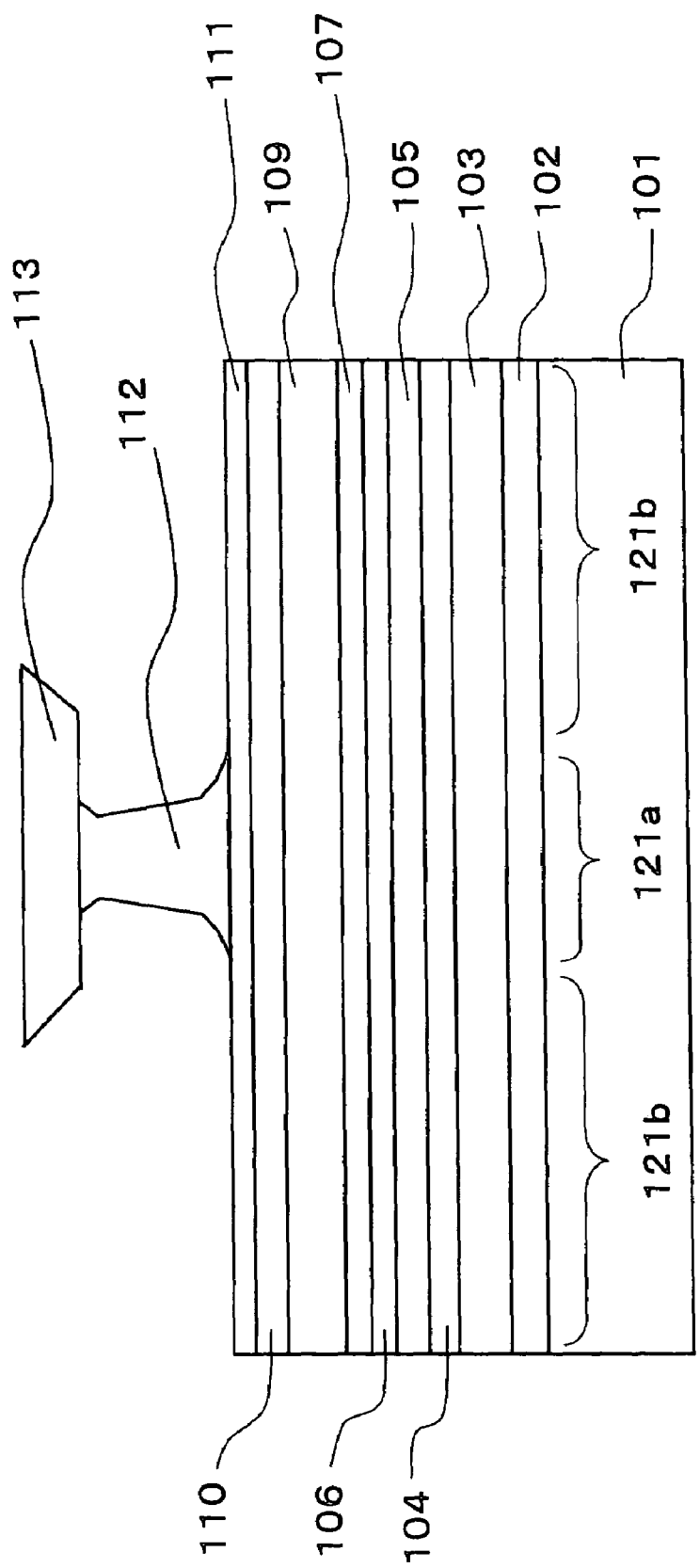
FIG. 3 is a cross section of the semiconductor laser device after completion of an etching process for forming a mesa stripe, taken along the plane perpendicular to the stripe direction.

Next, as shown in FIG. 3, etching is applied to portions other than the resist mask 114 (shown in FIG. 2) to thereby form a mesa-stripe portion 121a. This etching is carried out in two steps using a mixed aqueous solution of sulfuric acid and hydrogen peroxide, and hydrofluoric acid, until immediately above the etching stopper layer 111. The fact that the etching rate of GaAs by hydrofluoric acid is low enables planarization of the etched surface and control of the width of the mesa stripe portion. The etching depth is 1.95 μm, and the mesa-stripe has a width of about 2.5 μm in its lowermost portion. After the etching, the resist mask 114 is removed.

Figure 4:
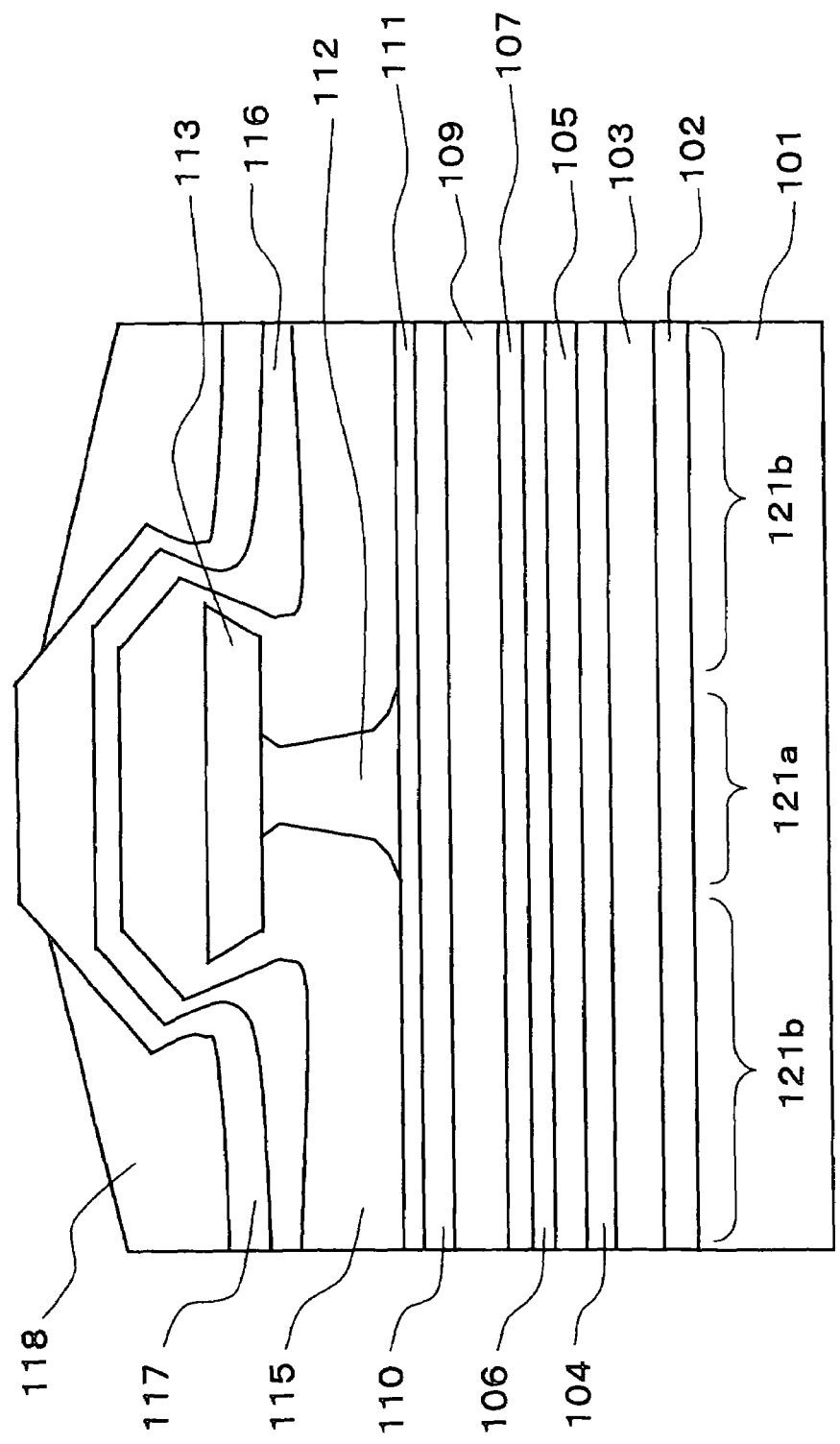
FIG. 4 is a cross section of the semiconductor laser device after completion of a process of crystal growth for current blocking layers, taken along the plane perpendicular to the stripe direction.

Subsequently, as shown in FIG. 4, an n-type $Al_{0.7}Ga_{0.3}As$ first current blocking layer 115 (thickness of 1.0 μm), an n-type GaAs second current blocking layer 116 (thickness of 0.3 μm) and a p-type GaAs planarizing layer 117 (thickness of 0.65 μm) are sequentially crystal-grown by metal organic chemical vapor deposition to form a light/current constriction region.

After that, as shown in FIG. 4, a resist mask 118 is formed only on both the lateral portions 121b by the photolithography process. Subsequently, the current blocking layers above the mesa stripe portion 121a are removed by etching. The etching is carried out in two steps using a mixed aqueous solution of ammonia and hydrogen peroxide and a mixed aqueous solution of sulfuric acid and hydrogen peroxide.

Thereafter, the resist mask 118 is removed, and a p-type GaAs cap layer 119 (thickness of 2.0 μm), shown in FIG. 1, is formed. In this manner, a semiconductor laser device having the structure shown in FIG. 1 is fabricated.

Figure 6:
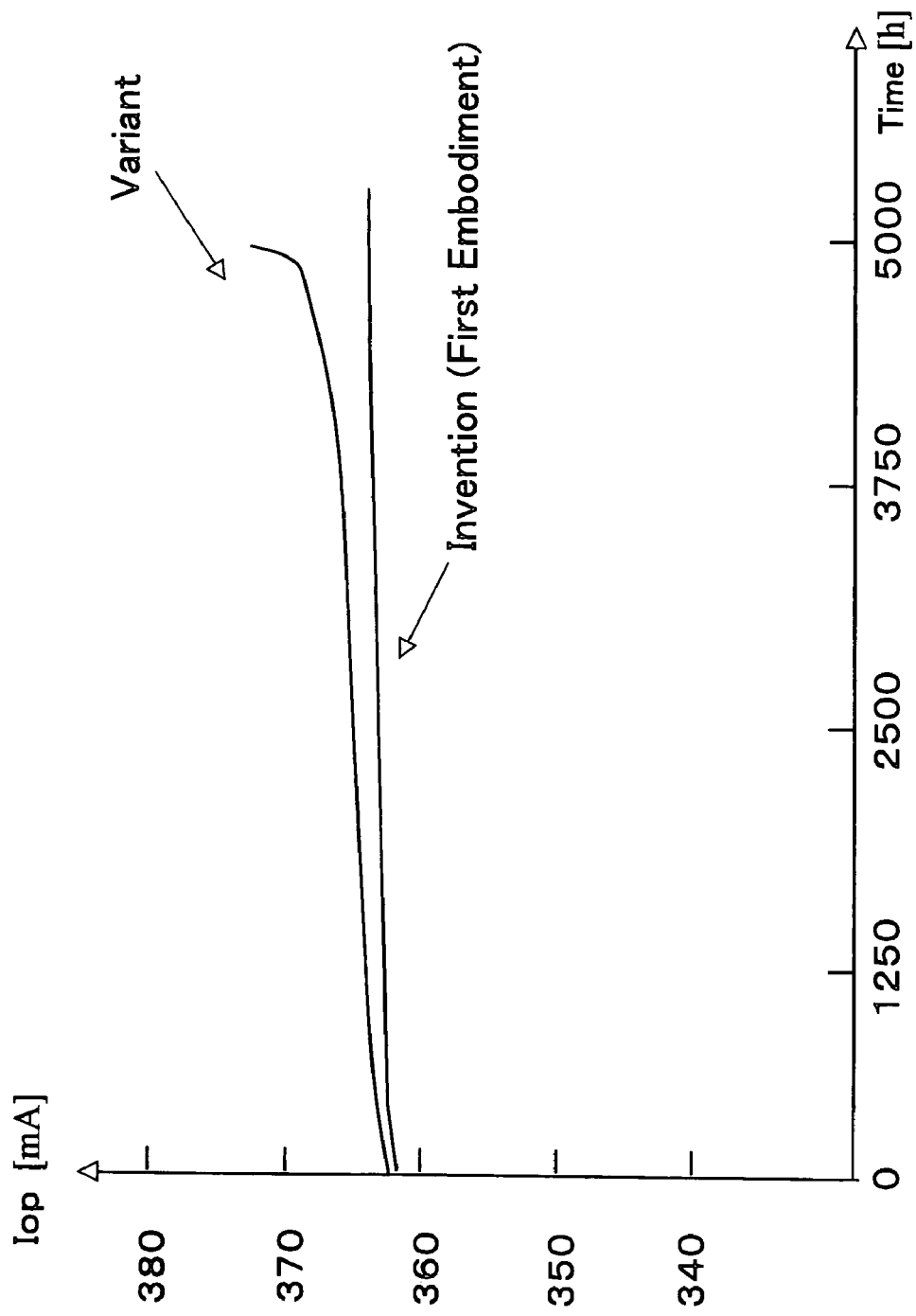
FIG. 6 is a graph showing reliability of the semiconductor laser devices that depends on structures of their lower guide layers.

In the first embodiment, as seen from FIG. 6, stable operation for 5000 hours or more was confirmed in reliability tests under the conditions of: an oscillation wavelength of 780 nm; a temperature of 70° C., and a pulse of 230 mW. In a graph shown in FIG. 6, Iop plotted along the axis of ordinates indicate current values when the output of the semiconductor laser device at 70° C. was 230 mW. A variant shown in FIG. 6 has the same construction as the first embodiment except that the lower guide layer of the variant is composed of only InGaP. The variant was a little poor compared with the first embodiment, but was able to implement stable operation for nearly 5000 hours.

So far, the present inventors have studied semiconductor laser devices that employ an InGaAsP quantum well active layer on the GaAs substrate. This time, a semiconductor laser device having a higher COD level compared with the one that employs AlGaAs was fabricated. In order to further improve the temperature characteristics of the semiconductor laser device in high-output operation, the lower guide layer formed of InGaP was provided whereby the characteristic temperature $T_o$ was raised to 210 K. It is considered that provision of the lower guide layer 106 having a thickness of 100 Å as in the first embodiment reduced leakage of carriers (holes in particular) from the active region, which led to an improvement in the characteristics.

Figure 5:
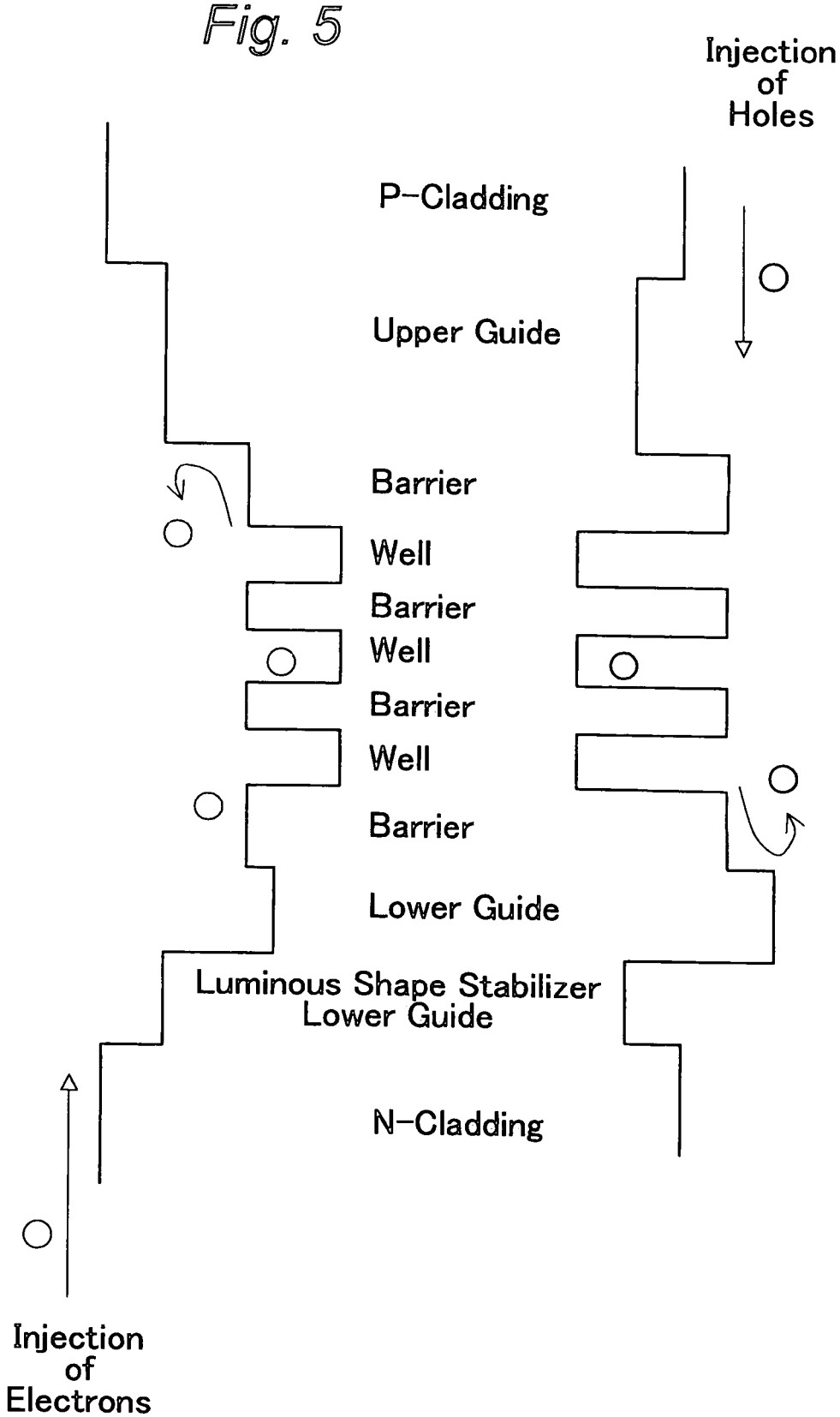
FIG. 5 is a simplified diagram of an energy band profile of the semiconductor laser device.

FIG. 5 schematically shows an energy band profile of the semiconductor laser device of the first embodiment. In the 780 nm band InGaAsP quantum well active layer on the GaAs substrate, a valence band top energy level (Ev) of barrier layers is lower than the energy level (Ev) of a guide layer formed of AlGaAs. That is, if the lower guide layer is formed of AlGaAs, there is formed a structure in which holes are apt to leak from the active region by tunneling at an interface between the lower guide layer and the barrier layer. This is considered to hinder further improvement of the characteristics. For that reason, in order to reduce leakage of holes, InGaP is used for the lower guide layer to make the energy level (Ev) of the lower guide layer lower than the energy level (Ev) of the barrier layers to prevent holes from tunneling, thereby making it possible to achieve the above effect. If the thickness of the lower guide layer is less than 30 Å, there is possibility that carriers tunnel and easily leak out. Thus, if the thickness thereof is 30 Å or more, the above effect can more optimally be obtained.

In the first embodiment, if the lower guide layer InGaP has a composition which is lattice-matched with the GaAs substrate or which has a compressive strain or a tensile strain of not more than 1%, the above effect can favorably be obtained. If the lower guide layer has a tensile strain, the energy level (Ev) is lowered more, which brings the effect of preventing leakage of holes. If the lower guide layer has a compressive strain, because the whole quantum well active layer has a tensile strain, the lower guide layer has the strain compensation effect. However, a strain quantity of more than 1% causes layers including the quantum well active layer to exceed a critical thickness and thus crystallinity deteriorates, resulting in deterioration of the characteristics. Accordingly, a compressive or tensile strain of not more than 1% is preferred as the strain quantity of InGaP. The strain quantity is herein represented by:

$$(a_1 - a_{GaAs})/a_{GaAs}$$

where $a_{GaAs}$ is a lattice constant of the GaAs substrate, and $a_1$ is a lattice constant of the well layer(s). If the value of the strain quantity is positive, the strain is called a compressive strain, and if the value is negative, it is called a tensile strain.

In the first embodiment, the upper guide layer is formed of AlGaAs. Thus, the effect of sufficiently suppressing an overflow of carriers (electrons in particular) is achieved by a conduction band bottom energy level (Ec) of AlGaAs. At the same time, because AlGaAs of the upper guide is not immediately adjacent to the well layer(s) where radiative recombination occurs, reliability is secured. When producing an Al-free semiconductor laser device in order to obtain high reliability, all the layers including guide layers and cladding layers are usually made Al-free using InGaP and so on. However, in the first embodiment, AlGaAs with an Al mole fraction of more than 0.2, by which a well-balanced conduction band energy difference ($\Delta Ec$) from the well layer(s) formed of InGaAsP having an oscillation wavelength of 780 nm is obtained, is provided as the upper guide layer.

Figure 8:
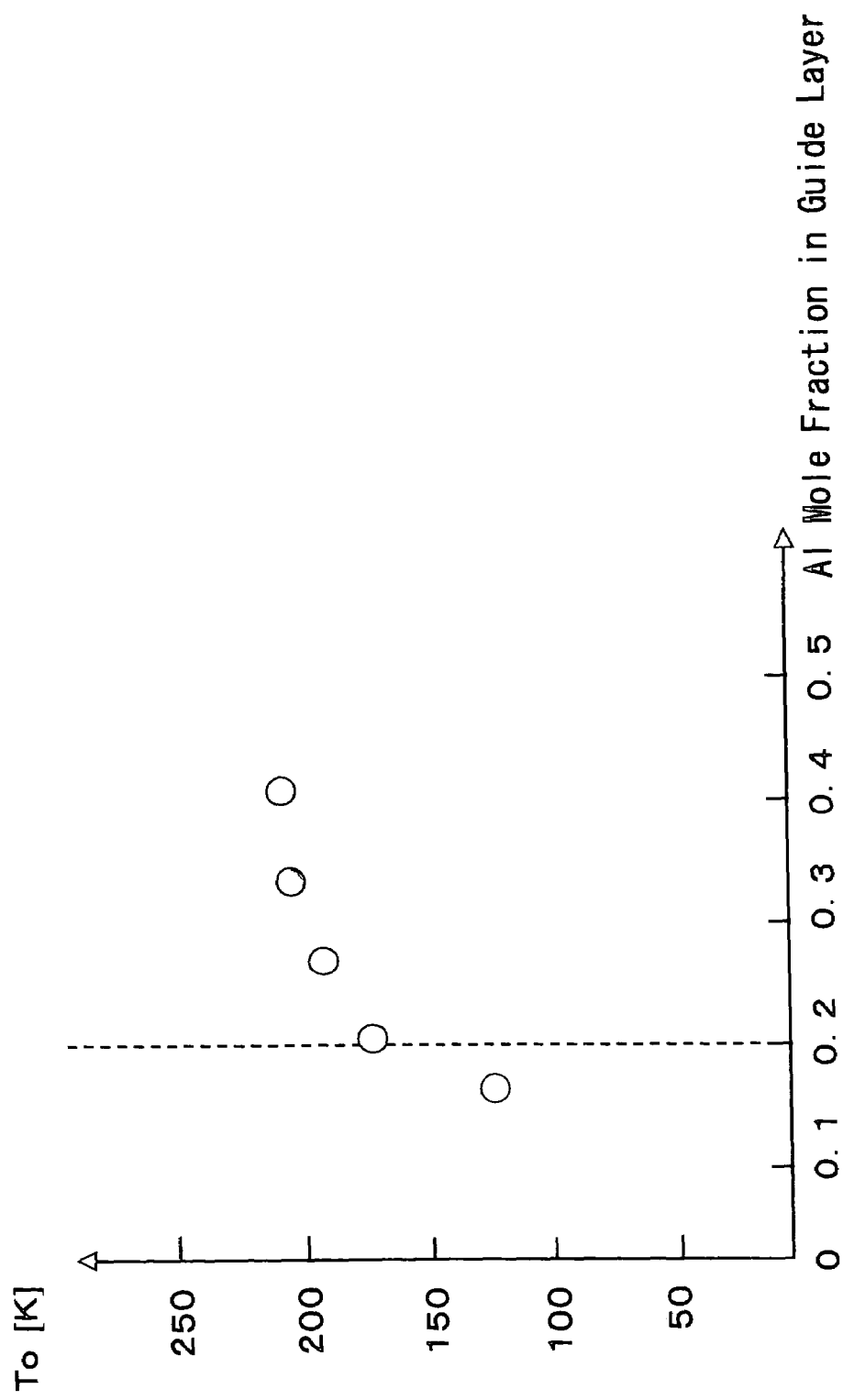
FIG. 8 is a graph showing a relationship between an Al mole fraction in a guide layer of the semiconductor laser device and a temperature characteristic (To)

FIG. 8 is a graph showing the relationship between an Al mole fraction and a characteristic temperature (To). As shown in FIG. 8, it was confirmed that the temperature characteristics were improved in the case of the guide layer of AlGaAs in which the Al mole fraction was more than 0.2, so that sufficiently high reliability was achieved.

In the first embodiment, providing the luminous shape stabilizer lower guide layer formed of AlGaAs between the lower guide layer and the lower cladding layer realizes a semiconductor laser device having good reliability in high-power operation. This is presumably attributed to the following. Not only InGaP but also AlGaAs that is the same material as that of the upper guide layer is used for the lower guide layer portion. This prevents light distribution from deteriorating or being unstable due to a difference in reflective index depending on the material used. Consequently, light distribution in stable shape is achieved. Furthermore, the Al mole fraction of the luminous shape stabilizer lower guide layer of 0.2 or more makes it possible to obtain the above effect more favorably.

Since the compressively strained well layer(s) formed of InGaAsP on the GaAs substrate is used in the first embodiment, the oscillation threshold current is reduced, whereby a semiconductor laser device which has high reliability in high-power operation particularly in the 780 nm band and which has a long lifetime is realized. Furthermore, since the compressive-strain quantity is not more than 3.5%, the above effect is optimally obtained.

Figure 7:
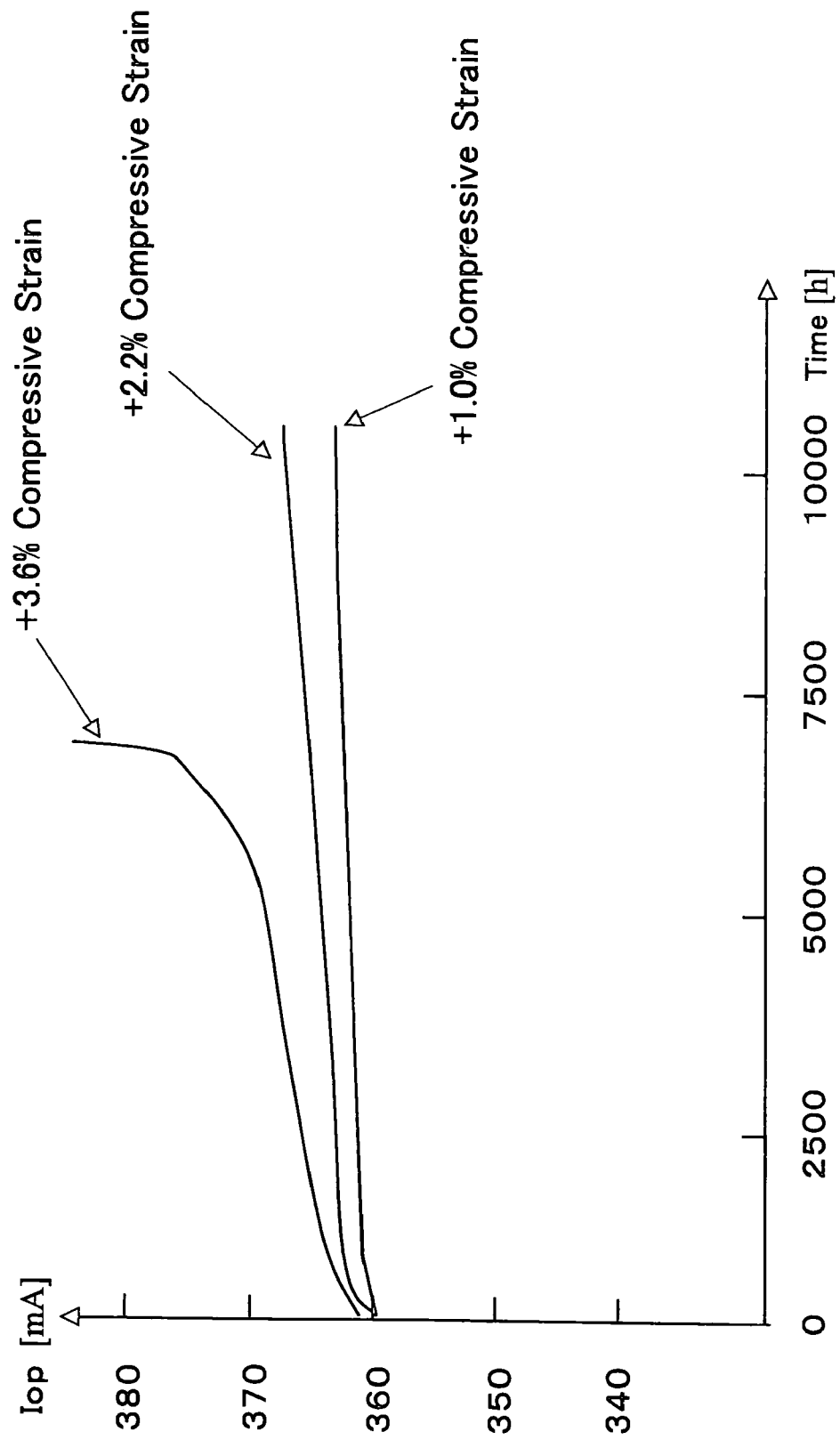
FIG. 7 is a graph showing reliability of the semiconductor laser devices that depends on compressive-strain quantities of their well layers.

FIG. 7 is a graph showing the reliability (70° C., 230 mW) of the semiconductor laser devices that depends on compressive-strain quantities of their well layers. It can be seen that if the compressive-strain quantity exceeds 3.5%, the reliability deteriorates. It is considered that this is attributable to deterioration of crystallinity due to an excessively large compressive-strain quantity.

Since the barrier layers each formed of InGaAsP and having a tensile strain are used in the first embodiment, they compensate the strain quantity of the well layers having a compressive strain, so that a strained quantum well active layer with more stable crystals can be fabricated. Consequently, a semiconductor laser device with high reliability can be realized. Furthermore, the tensile-strain quantity of not more than 3.5% makes it possible to obtain the above effect favorably.

In the first embodiment, the structure formed of the luminous shape stabilizer lower guide layer of AlGaAs and the second lower guide layer of InGaP is applied. The same effect can be obtained with only the lower guide layer composed of InGaP.

Although the first embodiment has a buried ridge structure, the present invention is not limited thereto. The same effect may be achieved in any structure including ridge structure, internal stripe structure, and buried heterostructure.

Although an n-type substrate is used in the first embodiment, the same effect may be achieved by using a p-type substrate and exchanging the n type and the p type of the layers in the above embodiment.

Although the wavelength of 780 nm is used, it is not limited thereto. The same effect may be achieved if the wavelength is more than 760 nm and less than 800 nm, namely, in the so-called 780 nm band. Furthermore, although the thickness of the p-type GaAs cap layer 119 is set to approximately 2.0 μm, it may be formed to a larger thickness of approximately 50 μm.

Second Embodiment

Figure 9:
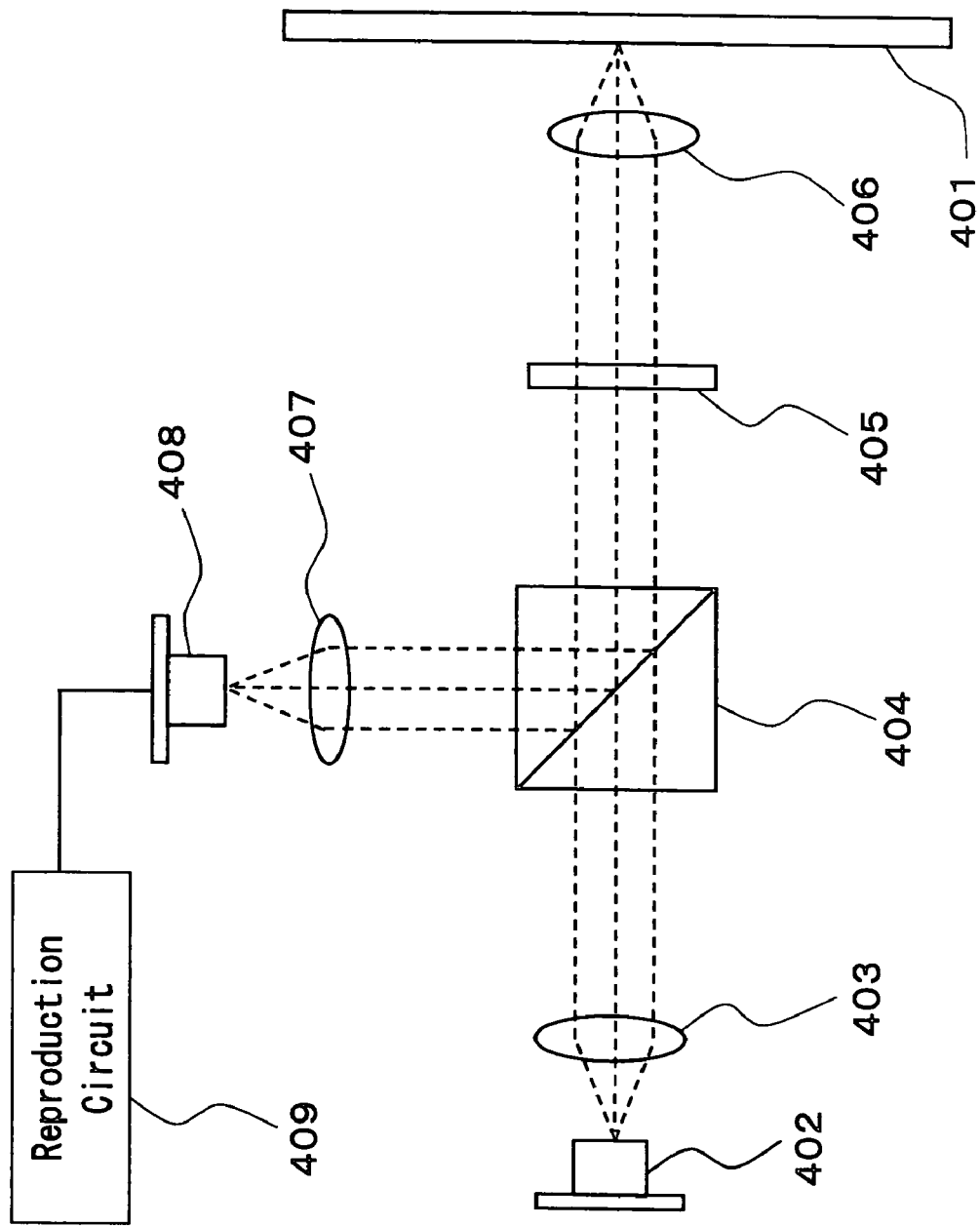
FIG. 9 is a schematic view of an optical disc unit according to a second embodiment of the present invention.
Figure 10:
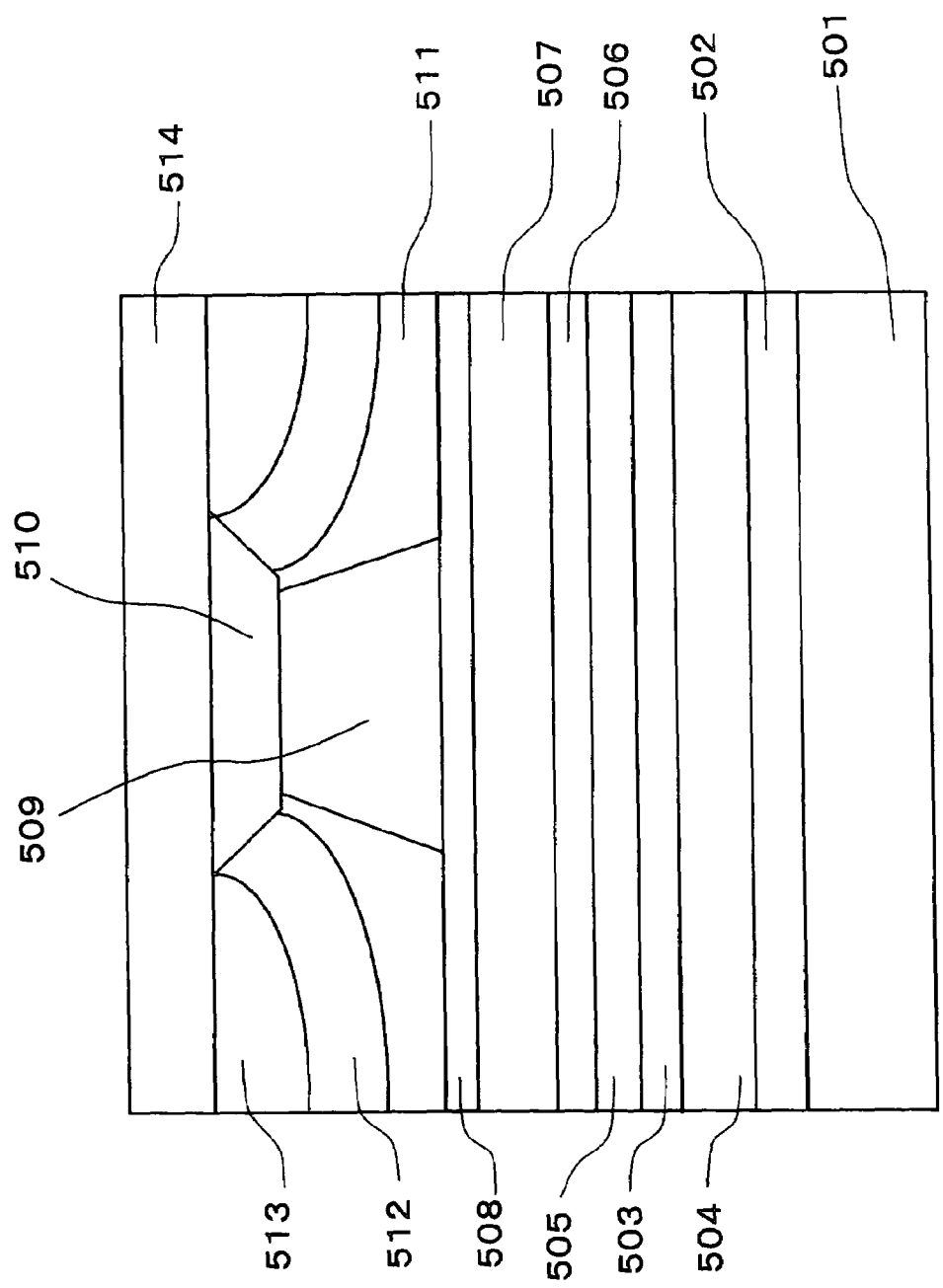
FIG. 10 is a cross section of a conventional semiconductor laser device, taken along a plane perpendicular to a stripe direction of the device.

FIG. 9 is a view showing an example of the structure of an optical disc unit according to the present invention. This optical disk unit operates to write data on an optical disk 401 and reproduce data written on the optical disk. In this optical disc unit, a semiconductor laser device 402 of the first embodiment is included as a light-emitting device for use in those operations.

This optical disk unit will be described in more detail. In this optical disk unit, for write operations, signal light emitted from the semiconductor laser device 402 passes through a collimator lens 403, becoming parallel light, and is transmitted by a beam splitter 404. Then, after its polarized state is adjusted by a λ/4 polarizer 405, the signal light is converged by an irradiation objective lens 406 to thereby irradiate the optical disk 401. For read operations, a laser beam with no data signal superimposed on the laser beam travels along the same path as in the write operation, irradiating the optical disk 401. Then, the laser beam reflected by the surface of the optical disk 401, on which data has been recorded, passes through the laser-beam irradiation objective lens 406 and the λ/4 polarizer 405, and is thereafter reflected by the beam splitter 404 so as for its traveling direction to be changed by 90°. Subsequently, the laser beam is focused by a reproduction-light objective lens 407 and applied to a signal-detection use photodetector device 408. Then, in the signal-detection use photodetector device 408, a data signal read from the optical disk 401 is transformed into an electric signal according to the intensity of the incident laser beam, and reproduced to the original information signal by a signal-light reproduction circuit 409.

The optical disk unit of the second embodiment employs the semiconductor laser device, as described above, which operates with higher optical power than conventional. Therefore, data read and write operations are implementable even if the rotational speed of the optical disk is increased to be higher than conventional. Accordingly, the access time to optical disks, which has hitherto mattered particularly in write operations, can be reduced to a large extent. This makes it feasible to provide an optical disk unit which allows more comfortable manipulation.

This embodiment has been described on a case where the semiconductor laser device of the present invention is applied to a recording and playback type optical disk unit. However, needless to say, the semiconductor laser device of this invention is applicable also to optical-disk recording units or optical-disk playback units using the 780 nm wavelength band.

The semiconductor laser device and the optical disc unit of the present invention should not be construed as being limited to the embodiments illustrated above. It is a matter of course that various modifications, such as the number of well layers/barrier layers and thicknesses of such layers, can be made without departing from the spirit of the invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:
    a GaAs substrate;
    an InGaAsP quantum well active layer supported on the GaAs substrate, said quantum well active layer being composed of one or a plurality of well layers and a plurality of barrier layers alternately disposed;
    an n-type cladding layer and a p-type cladding layer, which are provided in a manner so as to interpose the quantum well active layer therebetween;
    a first guide layer provided between the n-type cladding layer and the quantum well active layer; and
    a second guide layer provided between the p-type cladding layer and the quantum well active layer,
    wherein said semiconductor laser device has an oscillation wavelength of larger than 760 nm and smaller than 800 nm,
    wherein the first guide layer is formed of InGaP, and
    wherein the second guide layer is formed of AlGaAs and is in contact with the p-type cladding layer and the quantum well active layer.

2. The semiconductor laser device according to claim 1 wherein the first guide layer has a thickness of 30 Å or more.

3. The semiconductor laser device according to claim 1 wherein the first guide layer has a composition being lattice-matched with the GaAs substrate or having a compressive strain or a tensile strain of not more than 1% with respect to the GaAs substrate.

4. The semiconductor laser device according to claim 1 wherein an Al mole fraction of the second guide layer is 0.2 or more.

5. The semiconductor laser device according to claim 1 wherein the one or each well layer has a compressive strain.

6. The semiconductor laser device according to claim 5 wherein a quantity of the compressive strain is not more than 3.5%.

7. The semiconductor laser device according to claim 1 wherein the barrier layers have a tensile strain.

8. The semiconductor laser device according to claim 7 wherein a quantity of the tensile strain is not more than 3.5%.

9. A semiconductor laser device comprising:
    a GaAs substrate;
    an InGaAsP quantum well active layer supported on the GaAs substrate, said Quantum well active layer being composed of one or a plurality of well layers and a plurality of barrier layers alternately disposed;
    an n-type cladding layer and a p-type cladding layer, which are provided in a manner so as to interpose the quantum well active layer therebetween;
    a first guide layer provided between the n-type cladding layer and the quantum well active layer; and
    a second guide layer provided between the p-type cladding layer and the quantum well active layer,
    wherein said semiconductor laser device has an oscillation wavelength of larger than 760 nm and smaller than 800 nm,
    wherein the first guide layer is formed of InGaP, and
    wherein a luminous shape stabilizer guide layer formed of AlGaAs is provided between the first guide layer and the n-type cladding layer.

10. The semiconductor laser device according to claim 9 wherein an Al mole fraction of the luminous shape stabilizer guide layer is 0.2 or more.

11. An optical disc unit comprising:
    a light-emitting device for emitting light to irradiate an optical disc loaded; and
    an optical system for collimating the light emitted from the light-emitting device, directing the collimated light to the optical disc, and converging the light on the optical disc,
    wherein the light-emitting device comprises a semiconductor laser device including:
    a GaAs substrate;
    an InGaAsP quantum well active layer supported on the GaAs substrate, said quantum well active layer being composed of one or a plurality of well layers and a plurality of barrier layers alternately disposed;
    an n-type cladding layer and a p-type cladding layer, which are provided in a manner so as to interpose the quantum well active layer therebetween;
    a first guide layer provided between the n-type cladding layer and the quantum well active layer; and
    a second guide layer provided between the p-type cladding layer and the quantum well active layer,
    wherein said semiconductor laser device has an oscillation wavelength of larger than 760 nm and smaller than 800 nm,
    wherein the first guide layer is formed of InGaP, and
    wherein the second guide layer is formed of AlGaAs and is in contact with the p-type cladding layer and the quantum well active layer.

12. The optical disc unit according to claim 11 further comprising:
    a photodetector device for receiving signal light coming from the optical disc to convert the signal light to electric signal; and
    a reproduction circuit for reproducing data written to the optical disc from the electric signal.

13. An optical disc unit comprising:
    a light-emitting device for emitting light to irradiate an optical disc loaded; and
    an optical system for collimating the light emitted from the light-emitting device, directing the collimated light to the optical disc, and converging the light on the optical disc,
    wherein the light-emitting device comprises a semiconductor laser device including:
    a GaAs substrate;
    an InGaAsP quantum well active layer supported on the GaAs substrate, said quantum well active layer being composed of one or a plurality of well layers and a plurality of barrier layers alternately disposed;
    an n-type cladding layer and a p-type cladding layer, which are provided in a manner so as to interpose the quantum well active layer therebetween;
    a first guide layer provided between the n-type cladding layer and the quantum well active layer; and
    a second guide layer provided between the p-type cladding layer and the quantum well active layer,
    wherein said semiconductor laser device has an oscillation wavelength of large than 760 nm and smaller than 800 nm,
    wherein the first guide layer is formed of InGaP, and
    wherein a luminous shape stabilizer guide layer formed of AlGaAs is provided between the first guide layer and the n-type cladding layer.

14. The optical disc unit according to claim 13 further comprising:
    a photodetector device for receiving signal light coming from the optical disc to convert the signal light to electric signal; and
    a reproduction circuit for reproducing data written to the optical disc from the electric signal.

* * * * *